(12) United States Patent
Maa et al.

(10) Patent No.: US 7,265,030 B2
(45) Date of Patent: *Sep. 4, 2007

(54) METHOD OF FABRICATING SILICON ON GLASS VIA LAYER TRANSFER

(75) Inventors: Jer-Shen Maa, Vancouver, WA (US);
Jong-Jan Lee, Camas, WA (US);
Douglas J. Tweet, Camas, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 267 days.

This patent is subject to a terminal disclaimer.

(21) Appl. No.: 10/894,685

(22) Filed: Jul. 20, 2004

(65) Prior Publication Data

US 2006/0019464 A1    Jan. 26, 2006

(51) Int. Cl.
*H01L 21/46* (2006.01)

(52) U.S. Cl. .................. 438/458; 438/528; 438/977

(58) Field of Classification Search ............. 438/458, 438/977, 527, 528, 997
See application file for complete search history.

(56) References Cited

U.S. PATENT DOCUMENTS

| | | | |
|---|---|---|---|
| 6,562,703 B1 * | 5/2003 | Maa et al. | 438/518 |
| 6,852,652 B1 * | 2/2005 | Maa et al. | 438/197 |
| 6,992,025 B2 * | 1/2006 | Maa et al. | 438/795 |
| 7,018,882 B2 * | 3/2006 | Tweet et al. | 438/199 |
| 7,030,002 B2 * | 4/2006 | Tweet et al. | 438/602 |
| 7,067,430 B2 * | 6/2006 | Maa et al. | 438/705 |
| 7,071,042 B1 * | 7/2006 | Maa et al. | 438/166 |
| 2004/0253792 A1 * | 12/2004 | Cohen et al. | 438/400 |
| 2005/0250294 A1 * | 11/2005 | Ghyselen | 438/458 |
| 2006/0030124 A1 * | 2/2006 | Maa et al. | 438/459 |
| 2006/0051960 A1 * | 3/2006 | Tweet et al. | 438/660 |
| 2006/0063356 A1 * | 3/2006 | Park et al. | 438/459 |

OTHER PUBLICATIONS

K. Rim et al., *Strained Si for sub-100 nm MOSFETs*, Proceedings of the 3rd International Conference on SiGe Epitaxy and Heterostrcutures, Sante Fe, New Mexico, Mar. 9-12, 2002, p. 125.
M. Bruel et al., *Smart-Cut: A New Silicon On Insulator Material Technology Based on Hydrogen Implantation and Wafer Bonding*, Jpn. J. Appl. Phys., vol. 36, 1636 (1997).
Z.-Y. Cheng et al., *SiGe-on insulator (SGOI): Substrate Preparation and MOSFET Fabrication for Electron Mobility Evaluation*, 2001 IEEE International SOI Conference Proceedings p. 13.

(Continued)

*Primary Examiner*—Mary Wilczewski
*Assistant Examiner*—Seth Barnes
(74) *Attorney, Agent, or Firm*—David C. Ripma

(57) ABSTRACT

A method of fabricating a silicon-on-glass layer via layer transfer includes depositing a layer of SiGe on a silicon substrate; relaxing the SiGe layer; depositing a layer of silicon on the relaxed SiGe layer; implanting hydrogen ions in a second hydrogen implantation step to facilitate splitting of the wafer; bonding a glass substrate to the strained silicon layer to form a composite wafer; splitting the composite wafer to provide a split wafer; and processing the split wafer to prepare it for subsequent device fabrication.

21 Claims, 4 Drawing Sheets

OTHER PUBLICATIONS

Z. Cheng et al., *Relaxed Ssilicon-Germanium on Insulator Substrate by Layer Transfer*, Journal of Electronics Materials, vol. 30, No. 12, 2001, L37.

G. Taraschi et al., *Relaxed SiGe on Insulator Fabricated via Wafer Bonding and Layer Transfer: Etch-back and Smart-Cut Alternatives*, Electrochemical Society Proceedings vol. 2001-3, p. 27.

L.-J. Huang et al., *Carrier Mobility Enhancement in Strained Si-on-Insulator Fabricated by Wafer Bonding*, 2001 Symposium on VLSI Technology Digest of Technical Papers, p. 57.

7. T.A. Langdo et al., *Preparation of Novel SiGe-Free Strained Si on Insulator Substrates*, 2002 IEEE International SOI Conference Proceedings, Oct. 2001, p. 211.

P.D. Moran, et al., *Kinetics of Strain Relaxation in Semiconductor Films Grown on Borosilicate Glass-Bonded Substrates*, Journal of Electronics Materials, vol. 30, No. 7, 2001, 802.

R. Huang et al., *Relaxation of a Strained Elastic Film on a Viscous Layer*, Mat. Res. Soc. Symp. Proc. vol. 695, 2002.

Cai et al., *Single crystal silicon layer on glass formed by ion cutting*, Journal of Applied Physics, 92, 3388, (2002).

Wang et al., *Device transfer technology by backside etching for poly-silicon thin-film transistors on glass/plastic substrate*, Jpn. J. Appl. Phys., 42, L1044, (2003).

* cited by examiner

METHOD OF FABRICATING SILICON ON GLASS VIA LAYER TRANSFER

FIELD OF THE INVENTION

This invention relates to silicon-on-glass structures, and specifically to a method of fabricating silicon-on-glass using layer transfer.

BACKGROUND OF THE INVENTION

In strained silicon CMOS, carrier transport properties are enhanced by biaxial-tensile strain in a strained silicon layer on relaxed SiGe. Strained silicon MOSFETs have been fabricated on SiGe-on-insulator (SGOI) substrates and have demonstrated a combination of high mobility in strained silicon and the have advantages of SOI structures in sub-100 nm devices. Rim et al., *Strained Si for sub*-100 nm MOS-FETs, 3rd International Conference on SiGe Epitaxy and Heterostructures, March 9-12, Sante Fe, N. Mex., Proceedings p. 125 (2003).

Methods to fabricate SGOI substrates have been reported by groups at MIT and IBM. Transfer of a SiGe layer onto an insulator substrate is achieved using the Smart-Cut™ technique, which incorporates hydrogen implantation and annealing. Bruel et al., *Smart-Cut: A New Silicon On Insulator Material Technology Based on Hydrogen Implantation and Wafer Bonding*, Jpn. J. Appl. Phys., Vol. 36, 1636 (1997). Additional reports from the MIT group include: Cheng et al., *SiGe-on insulator: substrate preparation and MOSFET fabrication for electron mobility evaluation*, 2001 IEEE International SOI Conference Proceedings p. 13 (2001); Cheng et al., *Relaxed silicon-germanium on insulator substrate by layer transfer*, Journal of Electronics Materials, 30, L37 (2001); G. Taraschi et al., *Relaxed SiGe on insulator fabricated via wafer bonding and layer transfer: etch-back and Smart-Cut alternatives*, Electrochemical Society Proceedings Vol. 2001-3, p. 27 (2001). Reports from the IBM group is similar: Huang et al., *Carrier mobility enhancement in strained Si-on-insulator fabricated by wafer bonding*, 2001 Symposium on VLSI Technology Digest of Technical Papers, p. 57 (2001), which describe fabrication of a thick layer SiGe which is initially deposited on a silicon substrate, which includes a graded SiGe buffer layer and a relaxed SiGe layer having a constant germanium concentration. Following surface planarization by CMP, hydrogen is implanted into the SiGe layer for purposes of facilitating wafer splitting, and the wafer is bonded to an oxidized silicon substrate. The SiGe-on-oxide is separated from the remainder of the couplet by thermal annealing: splitting occurs along hydrogen-implantation-induced microcracks, which extend parallel to the bonding interface. A technique was also reported to form a SiGe-free strained silicon on insulator substrates. Langdo et al., *Preparation of novel-SiGe-free strained Si on insulator substrates*, 2002 IEEE International SOI Conference Proceedings, p. 211 (2002). This is very similar to the above technique, except that a thin layer of epitaxial silicon is deposited on SiGe before wafer bonding. After bonding and wafer splitting, the SiGe layer is removed by oxidation and HF etching, enabling the formation of very thin and uniform strained silicon on oxide surface.

Relaxation of strained SiGe layer after being transported onto viscous layer, such as BSG glass, is reported by Moran et al., *Kinetics of strain relaxation in semiconductor films grown on borosilicate glass-bonded substrates*, Journal of Electronics Materials, 30, 802 (2001); Huang et al., *Relaxation of a strained elastic film on a viscous layer*, Mat. Res. Soc. Symp. Proc. Vol 695, (2002). The relaxation of SiGe transferred directly to a glass substrate is disclosed pending patent application to Maa et al., Method of making relaxed silicon-germanium on glass via layer transfer, Ser. No. 10/674,369, filed Sep. 29, 2003.

More recently, a method to form strained silicon on insulator from film transfer and hydrogen implantation was disclosed in Maa et al., Strained silicon-on-insulator from film transfer and relaxation by hydrogen implantation, Ser. No. 10/755,615, filed Jan. 12, 2004. Instead of depositing a thick compositionally graded SiGe layer, followed by a fixed composition SiGe layer, an alternative method is disclosed wherein a thinner SiGe layer is deposited, having a thickness of between about 250 nm to about 350 nm, with either fixed or graded germanium composition. The relaxation is achieved by hydrogen implant relaxation. Strained silicon is deposited after CMP of the relaxed SiGe surface. Hydrogen, used to induce splitting, is targeted deep into the silicon substrate region, far below the strained silicon layer. In addition, the substrate silicon-to-SiGe interface helps to retard the propagation of defects and dislocations generated by hydrogen ion implantation in the silicon substrate region. A unique, low-temperature splitting, thinning, polishing and etching process have been adapted to fabricate strained-silicon-on-insulator (SSOI) material, without blister or flaking formation.

All of above-identified references, however, describe use of SiGe, or strained silicon, on oxide, or SiGe on glass, none of which are suitable for the formation of a strained silicon layer on a glass substrate.

Transfer of silicon to glass by hydrogen ion implantation, wafer bonding and splitting is described by Cai et al., *Single crystal silicon layer on glass formed by ion cutting*, Journal of Applied Physics, 92, 3388, (2002). However, Cai et al. do not use the SiGe layer to facilitate a selective etch, and the surface of silicon, therefore, is rough following splitting, and requires an elaborate process to smooth the roughness, as conventional CMP is difficult to control when the thickness of silicon is in the range of 30 nm to 50 nm. Also, Cai et al do not describe the transfer of strained silicon layer.

Wang et al., *Device transfer technology by backside etching for poly-silicon thin-film transistors on glass/plastic substrate*, Jpn. J. Appl. Phys., 42, L1044, (2003) describe a method to transfer thin film transistors to glass or plastic substrates by wafer bonding and backside etching. However, this is a complicated process and difficult to control. It is difficult to etch most of the wafer while leaving a uniform layer of silicon on the glass or plastic surface.

SUMMARY OF THE INVENTION

A method of fabricating a silicon-on-glass layer via layer transfer includes preparing a silicon substrate; depositing a layer of SiGe on the silicon substrate; implanting hydrogen ions into the silicon substrate through the SiGe layer in a first hydrogen implantation step; annealing the silicon substrate and SiGe layer in a first annealing step to relax the SiGe layer; thereby forming a relaxed SiGe layer; smoothing the relaxed SiGe layer; depositing a layer of silicon on the relaxed SiGe layer; implanting hydrogen ions in a second hydrogen implantation step to facilitate splitting of the wafer; preparing a glass substrate; bonding the glass substrate to the strained silicon layer to form a composite wafer; splitting the composite wafer to provide a split wafer having, in seriatim, a glass substrate, a layer of strained silicon; a layer of relaxed SiGe; and silicon layer split from the silicon substrate; dry etching the split wafer to remove the silicon layer split from the silicon substrate and a portion of the relaxed SiGe layer; annealing the split wafer to increase the bond between the strained silicon and the glass substrate in a second annealing step; selectively etching the split wafer to remove any remaining SiGe, thereby forming a strained silicon on glass wafer; completing a desired IC device on the silicon on glass wafer.

It is an object of the invention to fabricate strained silicon on a glass substrate.

Another object of the invention is to fabricate a layer of strained silicon is which is formed on a relaxed SiGe layer by hydrogen-implantation-induced relaxation, before transferring the relaxed SiGe layer to glass by direct wafer bonding and hydrogen induced exfoliation.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The purpose of this invention is to fabricate a strained silicon layer on a glass (SOG) substrate. The strained-silicon layer is first formed on a relaxed SiGe layer by hydrogen-implantation-induced relaxation. This film is then transferred to glass by direct wafer bonding and hydrogen induced exfoliation. Although part of SiGe layer is also transferred to glass, because of a high etch selectivity between SiGe and silicon, a very smooth silicon layer, having a thickness of less than 50 nm, easily may be achieved. The method of the invention makes it possible to develop advanced devices on inexpensive glass substrates. The current need for advanced display devices may be facilitated by the improved silicon quality as disclosed herein.

Instead of using an oxidized wafer, strained silicon on relaxed SiGe is bonded to Corning 1737 glass wafers. The process is similar to the strained-silicon-on-insulator (SSOI) process, described in Ser. No. 10/755,615, filed Jan. 12, 2004, which is incorporated herein by reference. The process steps are described in the following, and referring to FIG. 1, and FIGS. 2-10:

SiGe on Glass

Figure 1:
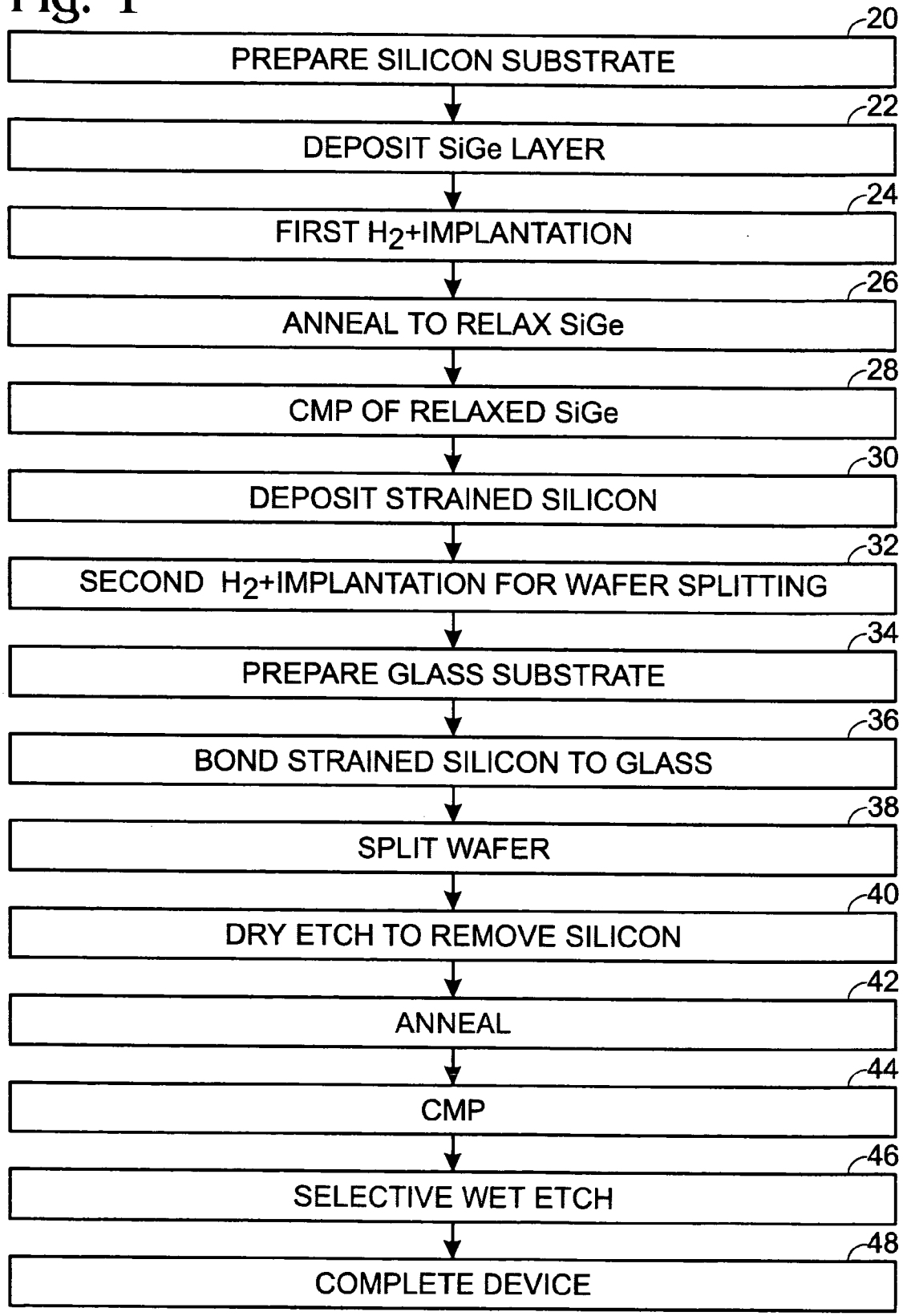
FIG. 1 is a block diagram of the method of the invention.
Figure 2:
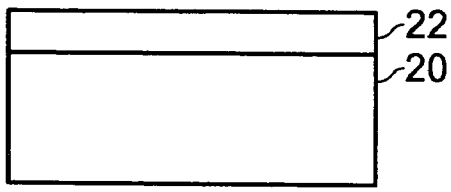
FIGS. 2-10 depict successive steps in the fabrication of a silicon-on-glass structure according to the method of the invention.
Figure 3:
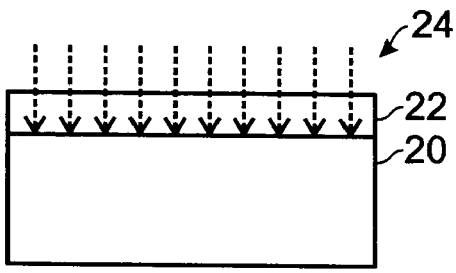

Referring now to FIGS. 1 and 2, a silicon substrate 20 is prepared, and a layer of SiGe 22 is deposited to a thickness of between about 40 nm to 500 nm. As shown in FIG. 3, a first hydrogen implantation 24 is done to induce relaxation of SiGe film. $H_2^+$ ions are implanted at an energy of between about 10 KeV and 100 KeV, at a dose of between about $2 \cdot 10^{14}$ t $cm^{-2}$ to $2 \cdot 10^{16}$ $cm^{-2}$. The substrate and deposited layers are then annealed 26 to relax the SiGe layer, wherein such annealing takes place at a temperature of between about 250° C. to 1000° C., for between about six seconds to four hours.

Figure 4:
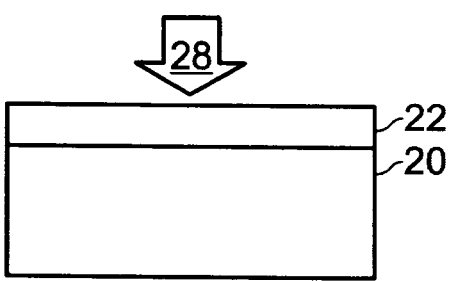

The wafer is then processed by chemical-mechanical polishing 28 (CMP), FIG. 4, to remove slight surface ripples resulting from the relaxation step. After CMP, the wafer surface is cleaned.

Figure 5:
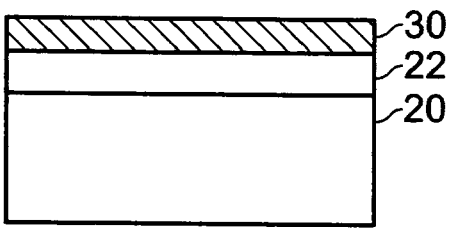
Figure 6:
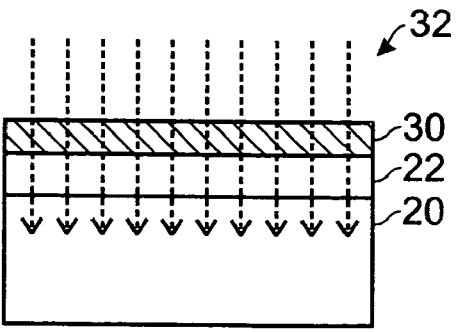

A layer of strained silicon 30 is deposited to a thickness of between about 10 nm to 50 nm, FIG. 5; and a glass substrate 34, is prepared. As will be understood by those of ordinary skill in the art, preparation of glass substrate 34, as used herein means preparation of a plain glass substrate, or preparation of a glass substrate coated with an insulating layer, such as an oxide layer, which insulating layer may be formed by any deposition method, such as plasma deposition, CVD, sputtering, or other state-of-the art deposition method. The insulating layer may be formed to a thickness of between about 10 nm to 1 μm.

A second $H_2^+$ ion implantation 32 is performed to facilitate wafer splitting, wherein the implant depth is targeted beyond 300 nm to 500 nm below the bulk Si/SiGe interface, for example at an energy of about 140 keV, and a dose of about 4E16 $cm^{-2}$ of $H^2+$ ions. Although the preferred implant energy is sufficient to drive the hydrogen deep into the silicon region, beyond the SiGe/silicon substrate interface, it is sufficient to implant hydrogen ions at a lower energy, depending on the intended use of the SOG substrate, e.g., for display or sensor device application.

Figure 7:
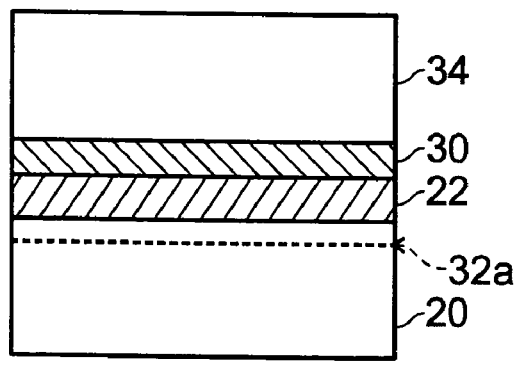
Figure 8:
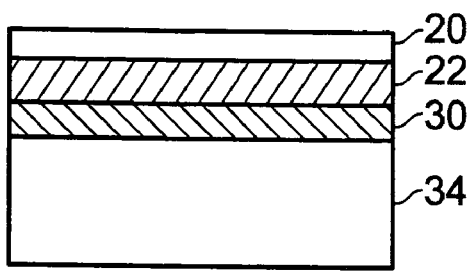

Referring now to FIG. 7. wafer bonding 36, after proper surface treatment, such as PECVD of oxide, and treating in dilute SC-1 solution, provides for bonding of glass substrate 34 to strained silicon layer 30, forming a composite wafer. The composite wafer is then split by thermal annealing 38 along the second hydrogen implant region, as shown at 32a, which results in the structure depicted in FIG. 8. This annealing step takes place at a temperature of less than 450° C., to avoid film blistering, e.g., 375° C. A typical split annealing likely takes between about one hour to three hours.

Figure 9:
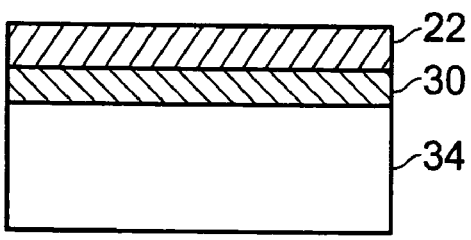
Figure 10:
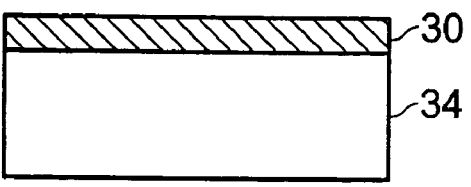

The wafer is dry etched 40 to remove silicon 20 and part of SiGe layer 22, resulting in the structure of FIG. 9. Dry etching is performed to remove silicon and SiGe and to ensure that no blisters will develop during a subsequent anneal step 42, which is performed to strengthen the bond between silicon and glass, to strengthen the bond. Wet etching is not appropriate at this state because of the possibility of the silicon-containing films lifting from the glass substrate because of the weak bonds which are in place at this point in the method of the invention. An annealing step 42 is performed to increase the bonding force between silicon 30 and glass substrate 34, or an insulating layer formed on substrate 34. This is an essential steps, because the silicon-glass bond must be strong enough to withstand the following steps in the method of the invention.

The next step in the method of the invention is CMP 44 of the wafer to remove roughness following wafer splitting. In an alternative embodiment, this step may be omitted, depending on the etch selectivity between SiGe and silicon during etching in a SC-1 solution and also depending on split surface roughness. A selective wet etch 46, for example in SC-1 solution, is performed to remove the remaining SiGe, resulting in the structure depicted in FIG. 10. After this step, additional fabrication steps 48 are performed to fabricate any desired device on the SOG wafer.

An alternative technique is to deposit epitaxial silicon on SiGe, and the SiGe may be relaxed after hydrogen implantation and relaxation anneal.

Although the method of the invention is described in connection with the transfer of strained silicon, a similar approach may be applied to transfer of unstrained silicon, wherein the steps of SiGe relaxation by hydrogen implantation and annealing are omitted. The CMP step to remove the surface ripple structure by relaxation is also not needed. The method of the invention, as applied to transfer of an unstrained silicon on glass wafer, is as follows: (1) SiGe deposition on silicon; (2) deposit silicon layer; (3) prepare a glass substrate; (4) bond the wafers after proper surface treatment; (5) split by thermal anneal; (6) dry etch to remove the extra silicon and part of the SiGe layer; (7) CMP, if necessary, to remove roughness as a result of wafer splitting; and (8) selective wet etch to remove remaining SiGe.

The relaxed SiGe, after CMP, has a thickness of between about 40 nm to 300 nm. The epitaxial silicon thickness varies from between about 30 nm to 350 nm. $H_2^+$ split implantation is performed at between about 50 keV to 160 keV, and at a dose of between about 2E16 $cm^{-2}$ to 6E16 $cm^{-2}$. Surface treatment prior to bonding is as described in the cited pending applications. Splitting is done at a temperature of between about 300° C. to 450° C., for between about two to three hours. After wafer split, the top silicon section and part of the SiGe layer are removed by a dry etch step. A post dry etch anneal was at done at between about 400° C. to 650° C. for between about thirty minutes to two hours. A fine scale CMP was carried out to remove the roughness from splitting, followed by a selective etch step to remove the SiGe layer.

Figure 11:
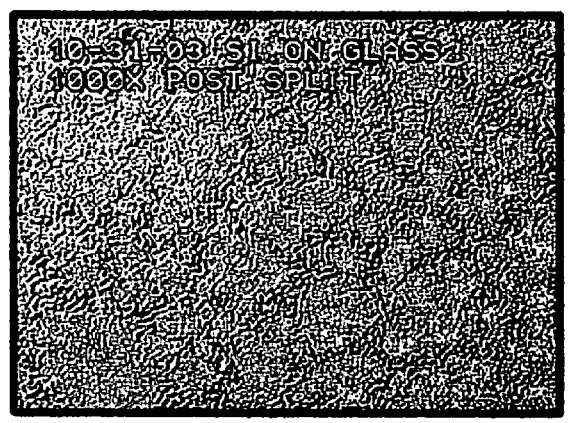
FIG. 11 depicts Si/SiGe/silicon on glass after splitting.
Figure 12:
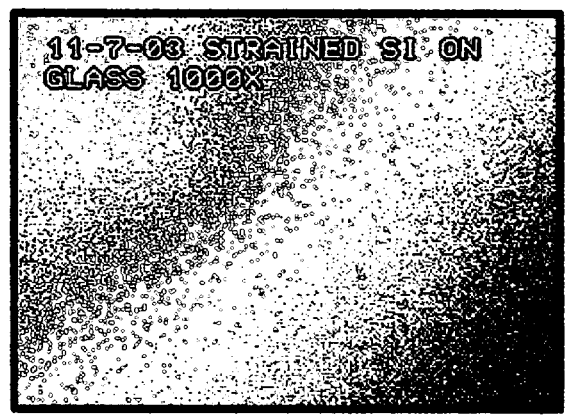
FIG. 12 depicts strain silicon on glass after the final selective etch step of the method of the invention.
Figure 13:
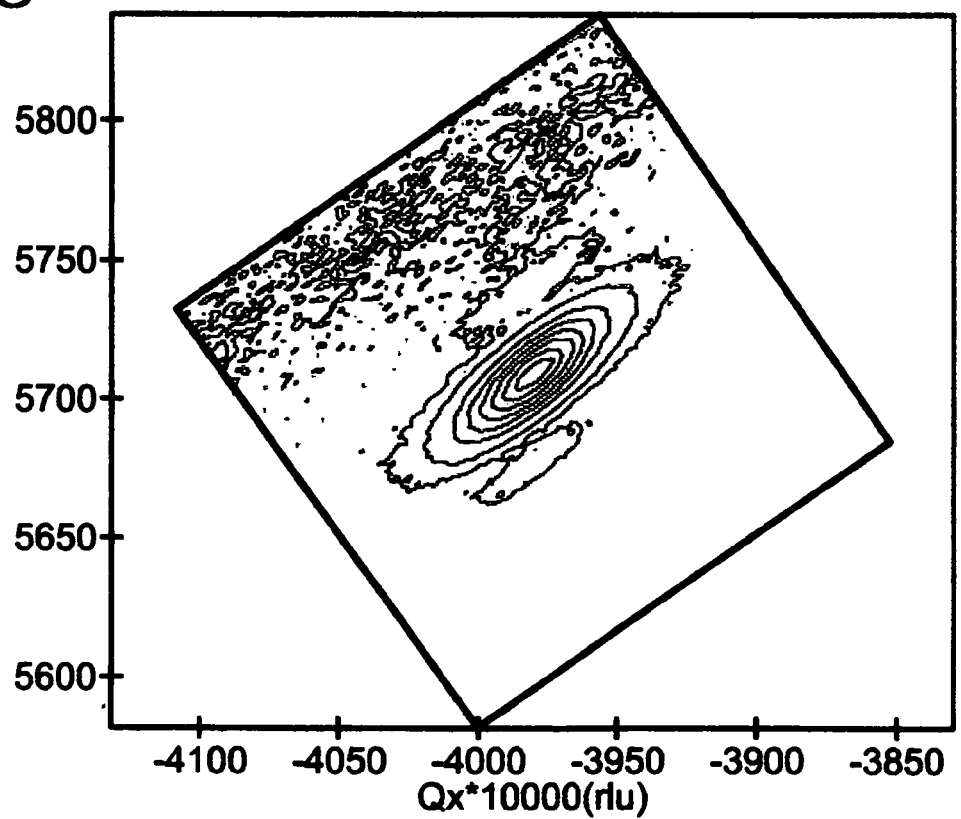
FIG. 13 is an XRD area map of strained silicon on glass.

FIGS. 11 and 12 compare wafer surface features immediately after splitting and after the final selective etch, respectively. FIG. 11 depicts a strained silicon/SiGe/silicon-on-glass after splitting wherein the strained silicon is about 35 nm thick. FIG. 12 depicts the strained silicon-on-glass wafer after the final selective wet etch step, wherein the 35 nm-thick silicon is shown to have a very smooth surface. The silicon is under 0.80% biaxial strain. Tensile strain is equivalent to a SiGe substrate which is 100% relaxed and has a germanium contend of between 20% to 30%. FIG. 13 depicts an XRD area map of the 35 nm strained silicon on glass. Tensile strain is equivalent to a SiGe substrate which is 100% relaxed having a germanium content of 21%.

Thus, a method of fabricating silicon on glass via layer transfer has been disclosed. It will be appreciated that further variations and modifications thereof may be made within the scope of the invention as defined in the appended claims.

We claim:

1. A method of fabricating a silicon-on-glass layer via layer transfer comprising:
    seriatim
    preparing a silicon substrate;
    depositing a layer of SiGe on the silicon substrate;
    depositing a layer of silicon on the SiGe layer;
    preparing a glass substrate;
    bonding the glass substrate to the silicon layer to form a composite wafer;
    splitting the composite wafer to provide a split wafer having, in seriatim, a glass substrate, a layer of silicon; a layer of SiGe; and silicon layer split from the silicon substrate;
    dry etching the split wafer to remove the silicon layer split from the silicon substrate and a portion of the SiGe layer;
    annealing the split wafer to increase the bond between the silicon and the glass substrate;
    selectively etching the split wafer to remove any remaining SiGe, thereby forming a silicon on glass wafer;
    completing a desired IC device on the silicon on glass wafer.

2. The method of claim 1 wherein said depositing a layer of SiGe includes depositing a layer of SiGe to a thickness of between about 40 nm to 50 nm.

3. The method of claim 1 wherein said depositing a layer of silicon includes depositing a layer of silicon to a thickness of between about 10 nm to 50 nm.

4. The method of claim 3 wherein said depositing a layer of silicon includes depositing a layer of strained silicon.

5. The method of claim 3 wherein said depositing a layer of silicon includes depositing a layer of unstrained silicon.

6. The method of claim 1 wherein said splitting includes annealing the composite wafer at a temperature of less than 450° C. to avoid blistering of the silicon/SiGe/silicon layer, for between about one hour to three hours.

7. The method of claim 1, which further includes, after said depositing a layer of SiGe on the silicon substrate, implanting hydrogen ions into the silicon substrate through the SiGe layer in a first hydrogen implantation step; annealing the silicon substrate and SiGe layer in a first annealing step to relax the SiGe layer; thereby forming a relaxed SiGe layer; and smoothing the relaxed SiGe layer; and wherein depositing a layer of silicon on the SiGe includes depositing a layer of strained silicon on the SiGe; implanting hydrogen ions in a second hydrogen implantation step through the strained silicon layer to facilitate splitting of the wafer; and wherein in said splitting includes splitting the composite wafer to provide a split wafer having, in seriatim, a glass substrate, a layer of strained silicon; a layer of relaxed SiGe; and silicon layer split from the silicon substrate.

8. The method of claim 7 wherein said first hydrogen implantation includes implanting $H_2^+$ ions are implanted at an energy of between about 10 KeV and 100 KeV, at a dose of between about $2 \cdot 10^{14}$ $cm^{-2}$ to $2 \cdot 10^{16}$ $cm^{-2}$.

9. The method of claim 7 wherein said wherein said second hydrogen implantation includes implanting $H_2^+$ ions to an implant depth of between about 300 nm to 500 nm below the Si/SiGe interface, at an energy of about 140 keV, and a dose of about $4 \cdot 10^{16}$ $cm^{-2}$.

10. The method of claim 7 wherein said annealing the split wafer includes annealing the composite wafer at a temperature of between about 400° C. to 650° C. for between about thirty minutes to two hours.

11. The method of claim 1 wherein said preparing a glass substrate includes preparing a substrate taken from the group of substrate preparations consisting of preparing a plain glass substrate and preparing a glass substrate coated with an insulating layer, wherein the insulating layer is deposited by a deposition method taken from the group of deposition methods consisting of plasma deposition, CVD, sputtering, and other state-of-the art deposition methods.

12. The method of claim 11 wherein the insulating layer may be formed to a thickness of between about 10 nm to 1 μm.

13. A method of fabricating a silicon-on-glass layer via layer transfer comprising:
    seriatim
    preparing a silicon substrate;
    depositing a layer of SiGe on the silicon substrate;
    implanting hydrogen ions into the silicon substrate through the SiGe layer in a first hydrogen implantation step;
    annealing the silicon substrate and SiGe layer in a first annealing step to relax the SiGe layer; thereby forming a relaxed SiGe layer;
    smoothing the relaxed SiGe layer;

depositing a layer of silicon on the relaxed SiGe layer;
implanting hydrogen ions in a second hydrogen implantation step to facilitate splitting of the wafer;
preparing a glass substrate;
bonding the glass substrate to the strained silicon layer to form a composite wafer;
splitting the composite wafer to provide a split wafer having, in seriatim, a glass substrate, a layer of silicon; a layer of relaxed SiGe; and silicon layer split from the silicon substrate;
dry etching the split wafer to remove the silicon layer split from the silicon substrate and a portion of the relaxed SiGe layer;
annealing the split wafer to increase the bond between the silicon and the glass substrate in a second annealing step;
selectively etching the split wafer to remove any remaining SiGe, thereby forming a silicon on glass wafer;
completing a desired IC device on the silicon on glass wafer.

14. The method of claim 13 wherein said depositing a layer of SiGe includes depositing a layer of SiGe to a thickness of between about 40 nm to 500 nm.

15. The method of claim 13 wherein said first hydrogen implantation includes implanting $H_2^+$ ions are implanted at an energy of between about 10 KeV and 100 KeV, at a dose of between about $2 \cdot 10^{14}$ cm$^{-2}$ to $2 \cdot 10^{16}$ cm$^{-2}$.

16. The method of claim 13 wherein said depositing a layer of silicon includes depositing a layer of strained silicon to a thickness of between about 10 nm to 50 nm.

17. The method of claim 13 wherein said second hydrogen implantation includes implanting $H_2^+$ ions to an implant depth of between about 300 nm to 500 nm below the Si/SiGe interface, at an energy of about 140 keV, and a dose of about $4 \cdot 10^{16}$ cm$^{-2}$.

18. The method of claim 13 wherein said splitting includes annealing the composite wafer at a temperature of less than 450° C. to avoid blistering of the silicon/SiGe/silicon layer, for between about one hour to three hours.

19. The method of claim 13 wherein said preparing a glass substrate includes preparing a substrate taken from the group of substrate preparations consisting of preparing a plain glass substrate and preparing a glass substrate coated with an insulating layer, wherein the insulating layer is deposited by a deposition method taken from the group of deposition methods consisting of plasma deposition, CVD, sputtering, and other state-of-the art deposition methods.

20. The method of claim 19 wherein the insulating layer may be formed to a thickness of between about 10 nm to 1 µm.

21. A method of fabricating a silicon-on-glass layer via layer transfer comprising:
seriatim
preparing a silicon substrate;
depositing a layer of SiGe on the silicon substrate;
implanting hydrogen ions into the silicon substrate through the SiGe layer in a first hydrogen implantation step;
annealing the silicon substrate and SiGe layer in a first annealing step to relax the SiGe layer; thereby forming a relaxed SiGe layer;
smoothing the relaxed SiGe layer;
depositing a layer of strained silicon on the relaxed SiGe layer;
implanting hydrogen ions in a second hydrogen implantation step to facilitate splitting of the wafer;
preparing a glass substrate;
bonding the glass substrate to the strained silicon layer to form a composite wafer;
splitting the composite wafer to provide a split wafer having, in seriatim, a glass substrate, a layer of strained silicon; a layer of relaxed SiGe; and silicon layer split from the silicon substrate;
dry etching the split wafer to remove the silicon layer split from the silicon substrate and a portion of the relaxed SiGe layer;
annealing the split wafer to increase the bond between the silicon and the glass substrate in a second annealing step;
selectively etching the split wafer to remove any remaining SiGe, thereby forming a silicon on glass wafer;
completing a desired IC device on the strained silicon on glass wafer.

* * * * *